(12) United States Patent
Weichsel et al.

(10) Patent No.: US 11,740,616 B2
(45) Date of Patent: Aug. 29, 2023

(54) METHOD AND COMPUTER-AIDED SYSTEM FOR DETECTING LIFE CYCLE INFORMATION ABOUT A SWITCHGEAR CABINET OF AN INDUSTRIAL INSTALLATION

(71) Applicant: RITTAL GMBH & CO. KG, Herborn (DE)

(72) Inventors: Thomas Weichsel, Erkelenz (DE); Thomas Michels, Troisdorf (DE); Lars Martin, Munzenberg (DE); Judith Zachrai, Herborn (DE)

(73) Assignee: RITTAL GMBH & CO. KG, Herborn (DE)

( * ) Notice: Subject to any disclaimer, the term of this patent is extended or adjusted under 35 U.S.C. 154(b) by 337 days.

(21) Appl. No.: 17/049,009

(22) PCT Filed: Apr. 17, 2019

(86) PCT No.: PCT/EP2019/059984
§ 371 (c)(1),
(2) Date: Oct. 19, 2020

(87) PCT Pub. No.: WO2019/202026
PCT Pub. Date: Oct. 24, 2019

(65) Prior Publication Data
US 2021/0271231 A1 Sep. 2, 2021

(30) Foreign Application Priority Data
Apr. 20, 2018 (EP) .................... 18168446

(51) Int. Cl.
*G05B 19/418* (2006.01)
*G06F 11/16* (2006.01)
(Continued)

(52) U.S. Cl.
CPC ......... *G05B 19/4188* (2013.01); *G06F 16/93* (2019.01); *G06F 30/10* (2020.01);
(Continued)

(58) Field of Classification Search
CPC .............. G05B 19/4188; G05B 19/418; G05B 19/4183; G05B 19/042; G06F 16/93;
(Continued)

(56) References Cited

U.S. PATENT DOCUMENTS 6,868,370 B1 * 3/2005 Burbridge .............. G06Q 10/06
703/22
6,965,855 B1 * 11/2005 Burbridge .......... G05B 23/0283
703/22
(Continued)

FOREIGN PATENT DOCUMENTS

DE 102013102635 A1 9/2014
EP 0637029 A2 2/1995
(Continued)

OTHER PUBLICATIONS

Kang, X. & Huiying, Z. "Design of Secondary Equipment Management System Based on CIM" IEEE Asia-Pacific Power & Energy Conf. (2012) available from <https://ieeexplore.ieee.org/abstract/document/6307435> (Year: 2012).*
(Continued)

*Primary Examiner* — Jay Hann
(74) *Attorney, Agent, or Firm* — Mark T. Vogelbacker; Eckert Seamans Cherin & Mellott, LLC

(57) ABSTRACT

A method and a system for collecting and processing of life cycle information about a switch cabinet (1) of an industrial plant, with a documentation server (2) for linking data sheet information (A) of the built-in modules (9a-9c) installed in the switch cabinet (1) on the basis of the planned construction (4) with function information (B) about their use in the context of the switch cabinet equipment, in order to store this information in a central archive database (3) under an individual switch cabinet identification (8) in data records, wherein test and acceptance information (C) of the switch cabinet (1) is added to the data records of the central archive database (3) via the documentation server (2).

9 Claims, 2 Drawing Sheets

(51) Int. Cl.
  *G06F 16/93* (2019.01)
  *G06F 30/10* (2020.01)
  *G06F 16/38* (2019.01)
  *G06Q 10/06* (2023.01)

(52) U.S. Cl.
  CPC ........ *G05B 19/4183* (2013.01); *G06F 16/381* (2019.01); *G06Q 10/06* (2013.01)

(58) Field of Classification Search
  CPC .... G06F 16/381; G06F 30/10; G06F 11/1446; G06F 11/1456; G06Q 10/06
  See application file for complete search history.

(56) References Cited

U.S. PATENT DOCUMENTS

| | | | | |
|---|---|---|---|---|
| 8,443,355 | B2* | 5/2013 | Wiese | G06Q 10/06 717/121 |
| 9,158,863 | B2* | 10/2015 | Malec | G06F 11/3058 |
| 9,471,819 | B2* | 10/2016 | Tucker | G06K 7/10366 |
| 10,007,579 | B2* | 6/2018 | Shaw | G06F 3/0619 |
| 10,387,669 | B1* | 8/2019 | Lim | G06F 21/604 |
| 11,507,068 | B2* | 11/2022 | Alenkov | G06F 16/90328 |
| 2013/0062403 | A1* | 3/2013 | Berschneider | G06K 19/06037 235/494 |
| 2017/0351226 | A1* | 12/2017 | Bliss | G05B 19/4063 |
| 2019/0042987 | A1* | 2/2019 | Heubach | G06F 16/25 |

FOREIGN PATENT DOCUMENTS

| | | |
|---|---|---|
| EP | 3229175 A1 | 10/2017 |
| WO | 2010054143 A1 | 5/2010 |
| WO | 2011154212 A1 | 12/2011 |

OTHER PUBLICATIONS

Wan, S., et al. "Exploring the Advantages of Content Management Systems for Managing Engineering Knowledge in Product-Service Systems" Procedia CIRP, vol. 56, pp. 446-450 (2016) available from <https://www.sciencedirect.com/science/article/pii/S2212827116310794> (Year: 2016).*

Birgit, Adam, "Inbetriebnahmeprotokoll", Feb. 14, 2018 (Feb. 14, 2018), pp. 1-3.

Written Opinion and International Search Report of PCT/EP2019/059984, dated Jul. 29, 2019.

* cited by examiner

METHOD AND COMPUTER-AIDED SYSTEM FOR DETECTING LIFE CYCLE INFORMATION ABOUT A SWITCHGEAR CABINET OF AN INDUSTRIAL INSTALLATION

This application is a National Phase Application of International Application No. PCT/EP2019/059984, filed Apr. 17, 2019 and entitled "METHOD AND COMPUTER-AIDED SYSTEM FOR DETECTING LIFE CYCLE INFORMATION ABOUT A SWITCHGEAR CABINET OF AN INDUSTRIAL INSTALLATION," which claims priority to European Patent Application No. 18168446.5, filed Apr. 20, 2018 and entitled "METHOD AND COMPUTERIZED SYSTEM FOR DETECTING OF LIFE CYCLE INFORMATION VIA AN ELECTRICAL ENCLOSURE OF AN INDUSTRIAL INSTALLATION," both of which are incorporated herein by reference in their entireties.

The invention relates to a process and a computer-aided system for collecting and processing life cycle information about an electrical switch cabinet of an industrial plant. Furthermore, the invention also comprises a computer program product carrying out the computer-aided process as well as a special data format containing life cycle information specific to the switch cabinet.

The field of the invention is primarily directed to switch cabinet construction for industrial plants. In addition, switch cabinets of the type of interest here are also occasionally used in the domestic sector. In principle, switch cabinets are used for the protected accommodation of electrical and/or electronic components, which are usually designed in the form of standardized built-in modules. These modules can be used, for example, to control automated production plants, process engineering plants, machine tools or similar. Thus, the built-in modules in the control cabinet are control components that are not directly placed in the machine as field devices. As built-in modules, for example, programmable logic controllers, complete computer units, frequency converters for speed control of motors, communication modules for bus connections to different bus systems, digital input/output modules or also analog input modules for reading in sensor data are used. In addition, a control cabinet usually also contains electrical terminal strips for connecting the electrical cabling at the place of use, thus establishing the connection to the power supply and the machines and systems to be controlled.

The planning of application-related enclosure equipment is usually software-supported, for example via EPLAN Pro Panel®, in the form of a CAD design. Such a planned design includes in particular a three-dimensional mounting layout in the form of a layout, virtual wiring of the electrical and electronic installation modules and, if necessary, other components, as well as power distribution systems adapted to these. The electrical or electronic built-in modules can be mounted, for example, by means of top-hat rails in the interior of the switch cabinet. In addition, the planned design also includes data sheet information A of the installed built-in modules. Such data sheet information can be, for example, the electrical power consumption, the degree of protection, the input/output connection configuration, the computing power, the manufacturer and/or the date of manufacture, the serial number and the like. Such datasheet information depends on the type of the built-in module.

Depending on the control cabinet equipment and the intended use of the control cabinet, test and acceptance measures must be carried out before the control cabinet can be put into operation at the site of operation in a way that ensures safe operation. The test and acceptance information resulting from the test phase must be documented in order to be able to prove that the switch cabinet was manufactured in accordance with the planning and the regulations.

In accordance with the generally known state of the art, this has so far been carried out in the area of switch cabinet construction by means of pre-fabricated switch cabinet folders in booklet form, which contain all relevant form fields for required entries, including a designation of the installed installation modules and their test and acceptance information. More detailed technical information about the built-in modules, such as data sheet information, is not part of the control cabinet folder. However, these are usually part of the documentation of the entire electronic system, which also includes the circuit diagrams, terminal diagrams, parts lists and device lists. For this reason, in a subsequent maintenance or repair case, a fitter is usually dependent on obtaining such supplementary technical information in addition to the basic information contained in the switch cabinet folder, so that a decision on repair options for a defective switch cabinet may not be made until a later date in this case.

The publication DE 101 16 539 B4 discloses an abstract, generally valid computer-aided process and system for automatic data processing in the field of production, assembly, service or maintenance of automation technology equipment. With special technical means of the so-called Augmented Reality, information is mechanics field of vision by appropriate human-technology-interaction, when he looks at a component. This can be, for example, installation instructions that replace a conventional installation manual. The technical solution presented here explicitly refers to the use of Augmented Reality in assembly as well as in the field of service and maintenance.

This is based on the problem that an expert in the phases of a product's life cycle, such as its creation, commissioning, maintenance and disposal, needs support in the form of extensive documentation, which is usually available in the form of manuals, assembly and maintenance instructions, technical drawings and the like in paper form. Increasingly, however, this documentation is also offered electronically and managed centrally via documentation servers. This documentation can be accessed via decentral operated devices, such as a computer worn on the body with data glasses or similar. In connection with this, means for recording instructions from users are also provided and information about the capabilities of the decentralized operating devices as well as about user preferences are included in the data processing, whereby the visualization of documentation data and the recording of instructions can be adapted depending on the data managed by the database. This opens up a variety of connectivity options. However, the presented state-of-the-art procedure and system is limited to data visualization only.

It is therefore the object of the present invention to create a special computer-aided method and system for the acquisition and processing of life cycle information in the field of control cabinet technology, which, in addition to a visualization of current documentation information about a control cabinet, also enables life cycle control.

The object is solved procedurally by linking at least data sheet information A of the installed built-in modules with function information B about their application in the context of the switch cabinet equipment at the time of the creation of the switch cabinet based on the planned design in order to store them in a central archive database under an individual switch cabinet identification in the form of data records. At the time of a subsequent technical acceptance of the switch cabinet, the required test and acceptance information C of the switch cabinet is added to the initially created data records, taking into account at least the data sheet information A. Subsequently, the completeness of at least the necessary test and acceptance information C is checked in order to trigger a commissioning release for the control cabinet. The commissioning release will only be given if all at least necessary test and acceptance information C is available and is part of the data records stored in the central archive database for the respective switch cabinet. The triggering of the commissioning release includes at least one connection from an energy source to the switch cabinet and/or at least one connection from the switch cabinet to the industrial plant in order to activate it. If the commissioning of the switch cabinet is carried out at the place of use after the commissioning release has been issued, the data records of the archive database are further enriched by supplementary commissioning information D of the switch cabinet, which is added from the central archive database via a decentralized user terminal preferably from the place of use of the switch cabinet.

The advantage of the solution in accordance with the invention is in particular that already at the time of the creation of the control cabinet a documentation is built up, which offers a higher depth of information than an otherwise usual control cabinet folder in paper form, in that not only the installed installation modules are named and marked, but also their data sheet information A is implemented in the documentation—linked in the simplest way. In addition, linked function information B provides information about the function that a particular built-in module has to fulfill within the scope of the control cabinet equipment, for example, the control of a frequency converter for a three-phase motor of a pump or similar.

Thanks to the ingenious solution, it is possible to carry necessary information throughout the product life cycle of the control cabinet and to update it dynamically. Transitions between different stages of a life cycle can be controlled to avoid errors during commissioning or later operation of the control cabinet.

According to another measure improving the invention, it is proposed that at the time of maintenance or repair work to be carried out after the switch cabinet has been put into operation, relevant maintenance information E or repair information F can be added to the archive database via a decentral operated user terminal in order to update the information on the current switch cabinet equipment. This update includes, for example, replacement information about defective built-in modules, an extension of the switch cabinet equipment with further built-in modules, for example a remote monitoring unit or similar.

According to another optional aspect of the invention, the three-dimensional planned construction required for the performance of a repair can be accessed in an advantageous manner via the decentral operable user terminal in order to be able to make a decision, for example, by means of supplementary construction information H resulting from this, as to whether a necessary repair can be performed on site or whether it is necessary to transfer the defective switch cabinet to a remote workshop. The same applies analogously to a planned further expansion of a control cabinet equipment.

In principle, the user or the cabinet manufacturer can make changes to cabinet-related data records in the archive database. This makes it possible for the user to make changes to the switch cabinet equipment himself, which are documented in the archive database. In addition, it is also possible that this documentation update measure is also carried out by the cabinet manufacturer, which is particularly advantageous in the case of major changes in the cabinet equipment in order to ensure data consistency. Thus, the solution according to the invention provides a dynamic documentation with access from different user levels. This also creates the prerequisite, for example, that after a change in the switch cabinet equipment, the standard-compliant modification can also be certified by an external body, for example in the form of certification according to a standard (DIN/EN/ISO/NEC/UL/CSA).

In accordance with another measure improving the invention, it is proposed that at the time of any malfunctions occurring in the operation of the switch cabinet, relevant malfunction information G of the switch cabinet is added to the archive database automatically or via a decentralized user terminal. If, for example, a power failure occurs, which interrupts the operation of the control cabinet as well as the industrial plant connected to it, this fault event is added to the archive database for the complete acquisition of life cycle information. Fault information G can also be, for example, the failure of an installation module or the exceeding of a permissible operating temperature. From such malfunction information G, maintenance intervals can be adjusted, for example.

Preferably, the life cycle information of the control cabinet accessible via the decentralized user terminal should only be retrievable after authorized entry of the control cabinet identification with password protection for visualization and adaptation of the information A to G stored in the archive database. By keeping the history of previously entered information in the archive database unalterable, misuse or sabotage can be avoided. The retrieval of lifecycle information of the control cabinet should be regulated according to a user profile and a corresponding access management, so that each user group is only provided with the information that interests them. For example, the manufacturer's user profile may contain all available information about the control cabinet equipment, the user of the control cabinet maybe restricted in access to the relevant operating data by a customized user profile, while a programmer of programmable logic controllers, for example, may only have access to information of such built-in modules.

Furthermore, it is suggested that each installation module is also provided with an individual identifier for unambiguous identification, which can be derived from its serial number, for example. This individual identifier can be attached to the built-in module as a QR code or similar. Furthermore, it is also possible to integrate the identification of built-in modules on an RFID chip in the built-in module. By means of the unique identification of the built-in modules, a targeted access to the documentation information stored for this purpose can be made via the decentralized user terminal. In this respect, the decentralized user terminal can include a QR code scanner. The user terminal is preferably designed as a mobile computer with display and input keyboard. A data connection to the central server with the archive database connected to it can be established via common data communication channels, for example via mobile radio.

It is advantageous to attach an image documentation file to the test and acceptance information C, commissioning information D, maintenance information E and/or repair information F contained in the archive database. This image documentation file can, for example, consist of a photo of the switch cabinet layout at the time of the respective event, which is added to the data record in the archive database for documentation purposes. In this sense, every change of the switch cabinet layout after a repair or maintenance can be additionally documented by means of images. In this way, changes made to the control cabinet layout at a later date can be traced more clearly. Furthermore, the so-called 'as built' documentation can also be included.

This includes at least the circuit diagram and a documentation of the 3D assembly layout planning. This documentation can form the basis against which the proper and professional implementation of the physical switch cabinet is checked.

Preferably, the documentation containing at least the information A to D is stored in the central archive database. In addition, it could also be stored on a shielded data carrier in the control cabinet as a backup copy. When using such a backup copy, it is suggested that the storage of changes in the central archive database should preferably be combined with an update of the backup copy, which should be forced by the central server in accordance with a change assistance system in order to ensure consistent multilocal electronic documentation.

Further measures to improve the invention are described in more detail below together with a description of a preferred execution example of the invention using the figures. It shows:

Figure 1:
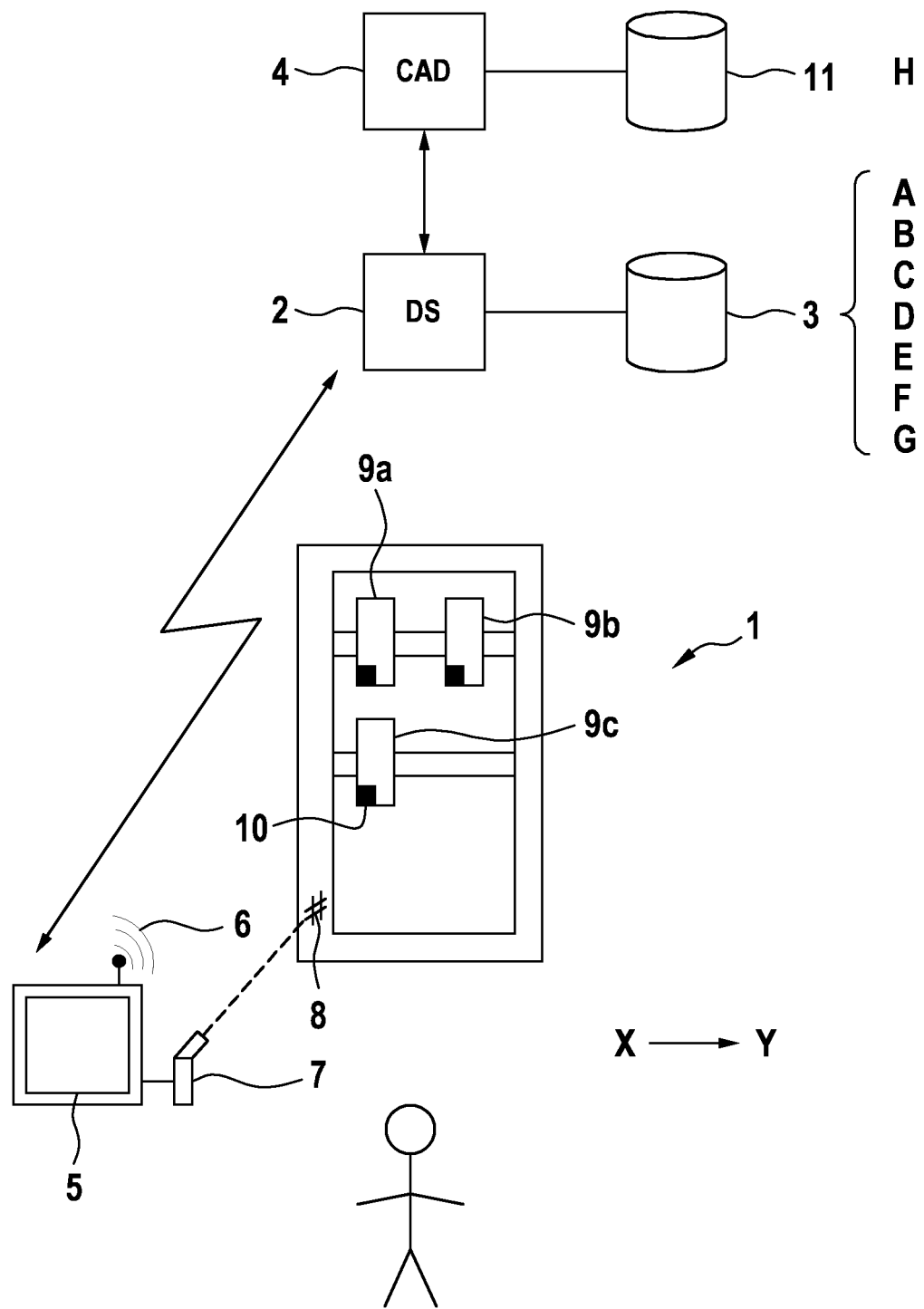
FIG. 1 is a schematic block diagram of a system for collecting and processing life cycle information about a control cabinet of an industrial plant.

According to FIG. 1, a system for the acquisition and processing of life cycle comprises a documentation server 2, which is placed at a central location far away from switch cabinet 1 and acquires and processes the life cycle information of a large number of switch cabinets. This lifecycle information is stored in prepared form in an archive database 3 assigned to the Documentation server 2.

The documentation server 2 extracts data sheet information A of the individual built-in modules 9a to 9c installed in switch cabinet 1, based on a planned construction 4 of switch cabinet 1, which was created in the planning phase of switch cabinet 1. These can be, for example, programmable logic controllers, input/output modules, electrical terminal blocks or similar. The documentation server 2 links this data sheet information A with function information B in order to store the data records in the archive database 3 under an individual switch cabinet identification 8. Function information B contains information regarding the purpose of each built-in module 9a to 9c, which may contain, for example, that a certain programmable logic controller controls operating cycles of a pump.

At location X, where the control cabinet 1 is located, an installer has a decentralized user terminal 5, which here is designed as a laptop with data transmission interface. Via the data transmission interface, e.g. mobile radio, the installer is able to retrieve information about the control cabinet 1 from the documentation server 2 and to store further data under the individual control cabinet identification 8 of the control cabinet 1 in the archive database 3 in order to build up a kind of electronic control cabinet folder.

For example, the installer carries out the necessary test and acceptance measures on cabinet 1 before commissioning cabinet 1 and adds the resulting test and acceptance information C of cabinet 1 to the archive database 3. To check which test and acceptance measures are necessary, the installer first accesses the data sheet information A of the individual installation modules 4a to 4c. This information may include, for example, the test voltage with which a prescribed test is to be performed. The documentation server 2 supports the installer in the context of the preparatory work for commissioning by completely recording the necessary test and acceptance information C. The documentation server 2 only triggers a commissioning release for the control cabinet 1 via the decentralized user terminal 5 when all necessary test and acceptance information C has been recorded in the archive database 3. It can be provided that an initial commissioning of control cabinet 1 can only be triggered via the decentralized user terminal 5, for example by issuing an initial switch-on control instruction to control cabinet 1. For this purpose, the decentralized user terminal 5 can have an NFC communication interface for control cabinet 1. Furthermore, the decentralized user terminal 5 of this design example is equipped with a QR code scanner 7, with which a QR code attached to the control cabinet 1 can be read in as a unique control cabinet identification. After reading in the individual switch cabinet identification 8 of switch cabinet 1, life cycle information of switch cabinet 1 can be retrieved remotely via the decentralized user terminal 5 from the documentation server 2, where it is processed, and in the opposite direction further life cycle information can be added to the archive database 3. In addition to reading in the control cabinet identification 8, the QR Code Scanner 7 can also be used in this example to read in individual identifications of the individual built-in modules 9a to 9c, which are also designed as QR Codes, in order to facilitate identification within the scope of the control cabinet equipment and to enable automatic access to specific data sheet information A for each built-in module 9a to 9c.

In addition, the data records of the archive database 3 contain a reference to the three-dimensional planned design 4 on which the control cabinet 1 is based, so that the decentralized user terminal 5 can also access design information H for the control cabinet equipment stored in a CAD database 11.

Figure 2:
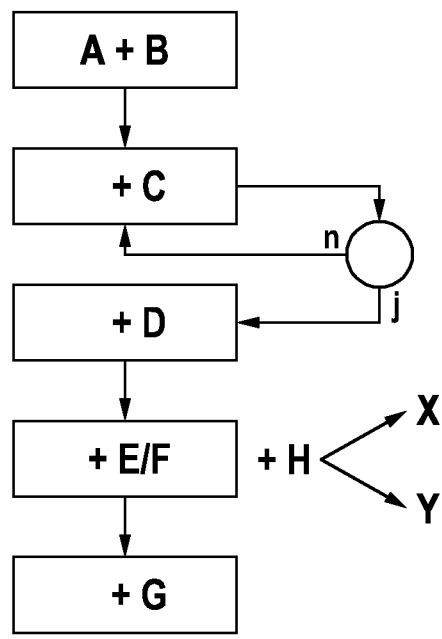
FIG. 2 shows a schematic flow chart of a procedure for the collection and processing of life cycle information, which is carried out in the system according to FIG. 1.

FIG. 2 illustrates individual process steps for the acquisition and processing of life cycle information about control cabinet 1, which is acquired and processed at different points in time or time phases of the life cycle of switch cabinet 1 in order to create a complete dynamic documentation of this information.

At time I of the creation of the switch cabinet, the data sheet information A of installed built-in modules is linked with function information B about their application in the context of the industrial plant, based on the planned design. From this, a data sheet structure is created in an archive database under the individual control cabinet identification.

At time II of a technical acceptance of the switch cabinet, test and acceptance information C of the switch cabinet is added. A test loop is used to check whether all necessary test and acceptance information C for the control cabinet is available. As long as this necessary information is not available, the system waits for the completion of the test and acceptance information C. If the necessary test and acceptance information C for the switch cabinet equipment is available, commissioning release for the switch cabinet is triggered, which results in a switch-on signal.

At time III, the commissioning of the switchgear cabinet is performed, whereby supplementary commissioning information D of the switchgear cabinet is added to the data records of the archive database. This commissioning information D can include, for example, the date and time of commissioning and the name of the installer performing the commissioning for documentation purposes.

Time IV marks maintenance or repair events that restrict or interrupt the normal operation of the control cabinet. For example, maintenance may involve the replacement of calibrated measuring instruments, such as electricity meters, and maintenance information E is added to the archive database. Similarly, a repair event of a defective built-in module is recorded by a related repair information F and added to the archive database. This repair information F can include, for example, the identification of a replaced built-in module, which is replaced by the new identification of the replacement device. In addition, the time of the repair and the installer responsible for it are recorded.

The dynamic documentation of the lifecycle information of the control cabinet supports a repair process in such a way that a decision can be made whether a repair is to be carried out on site X or in a remote workshop Y by referring back to data sheet information A or design information H.

In a similar way, points in time V in the life cycle of the switch cabinet are recorded in which disturbances in the operation of the control cabinet occur, for example power failures, which to the archive database 3 as disturbance information G. This information is temporarily stored in a temporary buffer of the switch cabinet 1 and can be transferred to the archive database by doing the buffer is read out by a user terminal.

Figure 3:
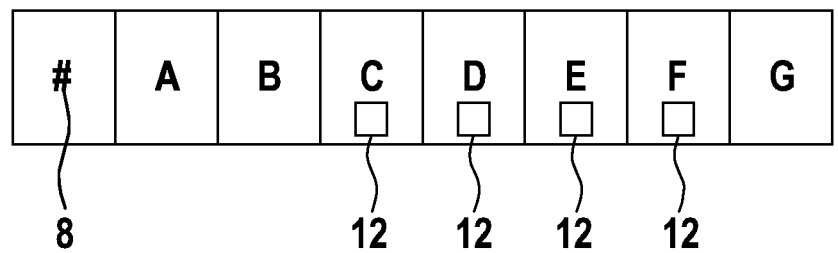
FIG. 3 shows a structure of a data format of an embodiment of the presently disclosed technology.

In FIG. 3 the structure of a data format containing special life cycle information of a control cabinet is given, whose key identifier represents the unique identifier 8 of the control cabinet. This key identifier can be converted by a numerical code, for example. An identifier of each built-in module installed in the control cabinet with assigned data sheet information A is added to the data set and linked with function information B about the built-in modules installed. Furthermore, the test and acceptance information C of the switch cabinet equipment resulting from the test phase of a manufactured switch cabinet as well as subsequent commissioning information D about the switch cabinet are added to the data set. Maintenance information E, repair information F and fault information G generated in the later life cycle complete the data format of the dynamic documentation about the life cycle of the switch cabinet. In particular, the test and acceptance information C, the commissioning information D and maintenance and repair information E/F can be supplemented with image documentation files 12, which contain, for example, a layout photo of the switch cabinet equipment generated at these points in time.

REFERENCE CHARACTER LIST

1 Switch cabinet
2 Documentation server
3 Archive database
4 Planned construction
5 Decentralized user terminal
6 NFC interface
7 QR Code Scanner
8 Switch cabinet identification
9 Installation module
10 Identification (of the built-in module)
11 CAD database
12 Image documentation file
A Data sheet information
B Functional information
C Test and acceptance information
D Commissioning information
E Maintenance information
F Reparation information
G Malfunction information
X on site
Y in Workshop

The invention claimed is:

1. A computer-aided method for collecting and processing of life cycle information for a switch cabinet (1) of an industrial plant, in which:
during construction of the switch cabinet (1), starting from a planned design (4), at least data sheet information (A) of the installation modules (9 a-9 c) is linked with function information (B) about their use in the industrial plant, in order to store this information in data records in a central archive database (3) under an individual switch cabinet identification (8), wherein in the case of a technical acceptance of the switch cabinet (1), test and acceptance information (C) of the switch cabinet (1) are added to the data sets, taking into account at least the data sheet information (A), wherein the planned design (4) includes a three-dimensional mounting layout and a virtual wiring of the electrical and electronic installation modules (9 a-9 c), and wherein the modules (9 a-9 c) are mounted within the switch cabinet (1) by top-hat rails;
during commissioning of the control cabinet (1), supplementary commissioning information (D) of the control cabinet (1) are added to the data records of the archive database (3) via a decentralized user terminal (5), wherein initiation of a commissioning release for the switch cabinet (1) by a documentation server (2) accessing the archive database (3) is carried out via the decentralized user terminal (5) when all necessary test and acceptance information (C), which are necessary for completeness of the test and acceptance information (C) previously recorded for this purpose by the user and which results from the stored data sheet information (A) of the installed built-in modules (9 a-9 c), have been added to the archive database (3);
wherein in the event of a malfunction of the switch cabinet (1) a malfunction information (G) of the switch cabinet (1) is added to the archive database (3) automatically or by the user via the user terminal (5), and wherein the malfunction information (G) includes the exceeding of a permissible operating temperature; and
wherein a backup copy of information A to D is stored on a shielded non-transitory data carrier in a control cabinet.

2. The computer-aided method according to claim 1, wherein, in the case of maintenance or repairs after the switch cabinet (1) has been put into operation, maintenance information (E) or repair information (F) of the switch cabinet (1) is added to the archive database (3) by the user via the decentral operable user terminal (5) in order to update the information on the current switch cabinet equipment.

3. The computer-aided method according to claim 2, wherein in order to carry out a repair, the planned design (4) on which the switch cabinet (1) is based is accessed in order to use design information (H) resulting therefrom to make a decision regarding the execution of the repair on site (X) or in a remote workshop (Y).

4. The computer-aided method according to claim 1, wherein current life cycle information of the switch cabinet (1) is called up via the decentral operable user terminal (5) after authorised input of the switch cabinet identification (8) for visualisation and adaptation of the information (A to G)

stored in the archive database (3), history of previously input information remaining unalterably stored in the archive database (3).

5. The computer-aided method according to claim 4, wherein retrieval of life cycle information of the switch cabinet (1) is filtered according to a user profile.

6. A system for collecting and processing of life cycle information for a switch cabinet (1) of an industrial plant, having a documentation server (2) for linking data sheet information (A) of installation modules (9 *a*-9 *c*) installed in the switch cabinet (1) on the basis of planned construction (4) with function information (B) about their use in the context of the switch cabinet equipment, in order to store these in a central archive database (3) under an individual switch cabinet identification (8) in data records, a user adding test and acceptance information (C) of the switch cabinet (1) to the data records of the central archive database (3) via a decentralized user terminal (5) via documentation server (2), taking into account at least data sheet information (A), wherein the planned construction (4) includes a three-dimensional mounting layout and a virtual wiring of the electrical and electronic installation modules (9 *a*-9 *c*), and wherein the modules (9 *a*-9 *c*) are mounted within the switch cabinet (1) by top-hat rails;
- wherein the user, during commissioning of the switch cabinet (1), via the decentralized user terminal (5), adds additional commissioning information (D) about the switch cabinet (1) to the data records of the archive database (3) in a retrievable manner, wherein the system is designed to trigger the commissioning of the control cabinet (1) by a documentation server (2) accessing the archive database (3) via the decentralized user terminal (5), on the basis of all necessary test and acceptance information (C) previously recorded by the user for completeness for this purpose, which results from the stored data sheet information (A) of the installed modules (9 *a*-9 *c*) added to the archive database (3);
- wherein in the event of a malfunction of the switch cabinet (1) a malfunction information (G) of the switch cabinet (1) is added to the archive database (3) automatically or by the user via the user terminal (5), and wherein the malfunction information (G) includes the exceeding of a permissible operating temperature; and
- wherein a backup copy of information A to D is stored on a shielded non-transitory data carrier in a control cabinet.

7. The system according to claim 6, wherein each built-in module (9 *a*-9 *c*) is provided with an individual, unambiguous identification (10), which is arranged in or on the built-in module (9 *a*-9 *c*) so as to be readable.

8. The system according to claim 6, wherein data records of the archive database (3) contain a reference to a three-dimensional planned design (4) on which the switch cabinet (1) is based, in order to access design information (H) stored in a CAD database (11).

9. The system according to claim 6, wherein a picture documentation file (12) is attached to the test and acceptance information (C) or the commissioning information (D) contained in the archive database (3).

* * * * *